(12) United States Patent
Sugaya

(10) Patent No.: US 10,270,485 B2
(45) Date of Patent: Apr. 23, 2019

(54) SWITCH MODULE AND RADIO-FREQUENCY MODULE

(71) Applicant: Murata Manufacturing Co., Ltd., Nagaokakyo-shi, Kyoto-fu (JP)

(72) Inventor: Yukiteru Sugaya, Nagaokakyo (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 0 days.

(21) Appl. No.: 15/590,055

(22) Filed: May 9, 2017

(65) Prior Publication Data

US 2017/0338851 A1 Nov. 23, 2017

(30) Foreign Application Priority Data

May 17, 2016 (JP) ................................. 2016-098894

(51) Int. Cl.

| H04B 1/44 | (2006.01) |
|---|---|
| H03H 7/01 | (2006.01) |
| H03H 7/46 | (2006.01) |
| H03K 17/693 | (2006.01) |
| H03K 17/76 | (2006.01) |
| H04B 1/00 | (2006.01) |

(52) U.S. Cl.
CPC ............ *H04B 1/44* (2013.01); *H03H 7/1741* (2013.01); *H03H 7/465* (2013.01); *H03K 17/693* (2013.01); *H03K 17/76* (2013.01); *H04B 1/006* (2013.01); *H03H 2250/00* (2013.01)

(58) Field of Classification Search
CPC ... H04B 1/40; H04B 1/44; H04B 1/48; H04B 1/0458; H04B 1/006; H04B 1/0053; H04B 1/0057; H04B 1/0067; H04B 1/0475; H04B 1/16; H04B 2203/5491
USPC .............................................. 455/78, 82, 83
See application file for complete search history.

(56) References Cited

U.S. PATENT DOCUMENTS

| 6,332,071 B1 * | 12/2001 | Brandt ...................... H01P 1/15 |
| | | 455/83 |
| 7,499,678 B2 * | 3/2009 | Shibagaki .............. H04B 1/006 |
| | | 455/78 |
| 8,391,805 B2 * | 3/2013 | Ishimori .............. H03K 17/063 |
| | | 455/78 |

(Continued)

FOREIGN PATENT DOCUMENTS

| CN | 105049068 A | 11/2015 |
| JP | 2005-260837 A | 9/2005 |

(Continued)

*Primary Examiner* — Quochien B Vuong
(74) *Attorney, Agent, or Firm* — Keating & Bennett, LLP

(57) ABSTRACT

A switch module includes a switch circuit and a filter. The switch circuit includes two or more selection terminals, a common terminal provided for the two or more selection terminals, and first and second bypass terminals. The filter is connected between the first and second bypass terminals and reduces harmonics of a radio-frequency signal which passes through the filter. The switch circuit is selectively switched between a first connection mode and a second connection mode. In the first connection mode, the common terminal is connected to any of the two or more selection terminals. In the second connection mode, the common terminal is connected to the first bypass terminal and the second bypass terminal is connected to any of the two or more selection terminals.

20 Claims, 14 Drawing Sheets

(56) References Cited

U.S. PATENT DOCUMENTS

| | | | |
|---|---|---|---|
| 9,083,402 B2* | 7/2015 | Asano | H04B 1/525 |
| 9,847,804 B2* | 12/2017 | Lee | H04B 1/18 |
| 9,866,261 B2* | 1/2018 | Laurila | H04B 1/44 |
| 2015/0145614 A1* | 5/2015 | Whitefield | H01P 1/15 |
| | | | 455/78 |
| 2015/0318889 A1 | 11/2015 | Lee et al. | |
| 2017/0149429 A1* | 5/2017 | Prevost | H03K 17/165 |

FOREIGN PATENT DOCUMENTS

| | | |
|---|---|---|
| WO | 2015/074713 A1 | 5/2015 |
| WO | 2015/077374 A1 | 5/2015 |

\* cited by examiner

SWITCH MODULE AND RADIO-FREQUENCY MODULE

CROSS REFERENCE TO RELATED APPLICATIONS

This application claims the benefit of priority to Japanese Patent Application No. 2016-098894 filed on May 17, 2016. The entire contents of this application are hereby incorporated herein by reference.

BACKGROUND OF THE INVENTION

1. Field of the Invention

Preferred embodiments of the present invention relate to a switch module and a radio-frequency module, and more particularly, to a radio-frequency module supporting carrier aggregation and a switch module included in the radio-frequency module.

2. Description of the Related Art

In accordance with an increasing number of communication devices such as cellular phones that support multiband communication, a multiband-support communication system that sends and receives signals in multiple communication bands (hereinafter simply called "bands") has been developed lately. Carrier Aggregation (hereinafter called "CA") in which radio-frequency signals of multiple bands are sent or received simultaneously may be applied to such a communication system. In this case, however, harmonics generated by transmitting a sending signal in a low-frequency band may leak into a receive path of a high-frequency band, which may degrade the receiving sensitivity of the high-frequency band.

To reduce a leakage of harmonics into the receive path of a high-frequency band, a low pass filter (LPF) for reducing harmonics is disposed in a transmit path of a low-frequency band or immediately under an antenna (see, for example, Japanese Unexamined Patent Application Publication No. 2005-260837).

If a LPF is disposed in a transmit path of a low-frequency band, this requires as many LPFs as there are low-frequency bands, which makes it difficult to form a space-saving communication device. If a LPF is disposed immediately under an antenna, only a single LPF is required for individual low-frequency bands, thus making it possible to form a space-saving communication device. In this configuration, however, it is necessary that the band of the LPF be broad enough to allow signals in the individual low-frequency bands to pass therethrough, which may increase the insertion loss accordingly. In the case of a non-Carrier-Aggregation (non-CA) mode, it is not necessary to reduce a leakage of harmonics into the receive path of a high-frequency band. In the non-CA mode, however, a radio-frequency signal is transmitted via the LPF, which may increase the insertion loss.

In a CA multiband-support communication system, there may be a disparity in impedance matching between when CA communication is performed and CA communication is not performed. That is, impedance mismatching may occur in the CA mode. To eliminate this impedance mismatching, it is necessary to provide a matching circuit. In such a configuration, however, in the non-CA mode in which it is not necessary to eliminate impedance mismatching, a radio-frequency signal is transmitted via this matching circuit, thus increasing the insertion loss.

SUMMARY OF THE INVENTION

Preferred embodiments of the present invention provide space-saving switch modules and space-saving radio-frequency modules which are less likely to increase the insertion loss in a non-CA mode while achieving desired characteristics in a CA mode.

According to a preferred embodiment of the present invention, a switch module includes a switch circuit and a filter. The switch circuit includes two or more selection terminals, a common terminal provided for the two or more selection terminals, and first and second bypass terminals. The filter is connected between the first and second bypass terminals and reduces harmonics of a radio-frequency signal which passes through the filter. The switch circuit is selectively switched between a first connection mode and a second connection mode. In the first connection mode, the common terminal is connected to any of the two or more selection terminals. In the second connection mode, the common terminal is connected to the first bypass terminal and the second bypass terminal is connected to any of the two or more selection terminals.

In the first connection mode, a radio-frequency signal is transmitted without passing through the filter, and the insertion loss is thus unlikely to increase. In the second connection mode, a radio-frequency signal is transmitted via the filter, thus making it possible to reduce harmonics of this radio-frequency signal. The switch module is in the second connection mode when CA communication is performed, while the switch module is in the first connection mode when CA communication is not performed. It is thus less likely to increase the insertion loss in the non-CA mode while achieving desired characteristics in the CA mode by reducing defects, such as degradation of the receiving sensitivity caused by a leakage of harmonics.

The filter is connected between the first and second bypass terminals. In the second connection mode, a radio-frequency signal is thus transmitted via the filter regardless of with which selection terminal the second bypass terminal is connected. This eliminates the need to provide as many filters as the selection terminals, thus saving the space of the switch module.

By using the switch module according to preferred embodiments of the present invention, it is less likely to increase the insertion loss in the non-CA mode while achieving desired characteristics in the CA mode and also saving the space of the switch module.

In the first connection mode, at least one of the first and second bypass terminals may be connected to a ground.

This configuration enhances the isolation between a path through which a radio-frequency signal is transmitted and the filter in the first connection mode. It is thus possible to reduce the influence of the filter on a radio-frequency signal in the non-CA mode.

The filter may include a plurality of filters which are mutually exclusively selected and which reduce different orders of harmonics.

A filter reducing a higher order of harmonics achieves a smaller insertion loss. In the second connection mode, a suitable filter is selected among the plurality of filters in accordance with the order of harmonics required to be reduced, thus making it possible to reduce the insertion loss while suppressing harmonics. A suitable filter is selected in accordance with the relationship between the frequency of a band in a high-frequency band and that in a low-frequency band (in particular, the receive band of the high-frequency band and the transmit band of the low-frequency band) simultaneously sent or received in the CA mode. This makes it possible to reduce the insertion loss in the low-frequency band while avoiding degradation of the receiving sensitivity in the high-frequency band.

The filter may include a LC parallel resonance filter and a capacitor. The LC parallel resonance filter is disposed in series with a bypass path connecting the first and second bypass terminals and includes an inductor and a capacitor connected in parallel with each other. The capacitor is disposed in parallel with the LC parallel resonance filter and is selectively connected in parallel with the LC parallel resonance filter in the second connection mode.

By connecting or disconnecting the capacitor to or from the LC parallel resonance filter, the switch module selectively enters a first state in which a first frequency is used as the attenuation pole or a second state in which a second frequency lower than the first frequency is used as the attenuation pole. This saves space in the switch module, compared with a configuration in which plural filters having different attenuation poles are provided and one of them is selected in accordance with the frequency to be attenuated. Changing of the capacitance of the capacitor adjusts the attenuation pole in the second state. As a result, the attenuation pole is adjusted more precisely.

In the second connection mode, the common terminal may be electrically connected to one of the two or more selection terminals which is different from the selection terminal connected to the second bypass terminal.

In the second connection mode, a radio-frequency signal transmitted via the selection terminal connected to the common terminal does not pass through the filter. In the second connection mode, if the selection terminal connected to the common terminal corresponds to a high-frequency band and if the selection terminal connected to the second bypass terminal corresponds to a low-frequency band, a switch circuit of the high-frequency band and a switch circuit of the low-frequency band are able to be integrated into one switch circuit. This saves space in the switch module.

According to a preferred embodiment of the present invention, a switch module includes a switch circuit and a matching circuit. The switch circuit includes two or more selection terminals, a common terminal provided for the two or more selection terminals, and first and second bypass terminals. The matching circuit is connected between the first and second bypass terminals. The switch circuit is switched between a first connection mode and a second connection mode. In the first connection mode, the common terminal is connected to any of the two or more selection terminals. In the second connection mode, the common terminal is connected to the first bypass terminal and the second bypass terminal is connected to any of the two or more selection terminals.

In a switch module according to a preferred embodiment of the present invention, the switch circuit is selectively switched between the first connection mode and the second connection mode, as in the switch module according to the above-described preferred embodiments. Advantages similar to those of the above-described preferred embodiment are thus achieved.

This will be explained more specifically. In the first connection mode, a radio-frequency signal is transmitted without passing through the matching circuit, and the insertion loss is thus unlikely to increase. In the second connection mode, radio-frequency signals are transmitted via the matching circuit, thus making it possible to reduce impedance mismatching in the switch circuit. The switch module is in the second connection mode when CA communication is performed, while the switch module is in the first connection mode when CA communication is not performed. It is thus less likely to increase the insertion loss in the non-CA mode while achieving desired characteristics in the CA mode by reducing impedance mismatching.

The matching circuit is connected between the first and second bypass terminals. This reduces impedance mismatching regardless of with which selection terminals the second bypass terminal is connected in the second connection mode. This eliminates the need to provide as many matching circuits as the selection terminals, thus saving space in the switch module.

A preferred embodiment of the present invention may be implemented as a radio-frequency module including such a switch module. According to a preferred embodiment of the present invention, a radio-frequency module which supports CA in which radio-frequency signals in multiple frequency bands are simultaneously sent or received is provided. The radio-frequency module includes one of the above-described switch modules and a control circuit. The control circuit causes the switch circuit to be in the first connection mode when CA is not performed and causes the switch circuit to be in the second connection mode when CA is performed.

According to a preferred embodiment of the present invention, it is less likely to increase the insertion loss in a non-CA mode while achieving desired characteristics in a CA mode and also saving space in a switch module or a radio-frequency module.

The above and other features, elements, characteristics and advantages of the present invention will become more apparent from the following detailed description of preferred embodiments of the present invention with reference to the attached drawings.

DETAILED DESCRIPTION OF THE PREFERRED EMBODIMENTS

Preferred embodiments of the present invention will be described below in detail with reference to the accompanying drawings. All of the preferred embodiments described below illustrate preferred specific examples. Numeric values, components, and positions and connection modes of the components illustrated in the following preferred embodiments are only examples, and are not limiting of the present invention. Among the components illustrated in the following preferred embodiments, the components that are not recited in the independent claims which embody the broadest concept of various preferred embodiments of the present invention will be described as optional components defining more preferable preferred embodiments.

First Preferred Embodiment

Figure 1:
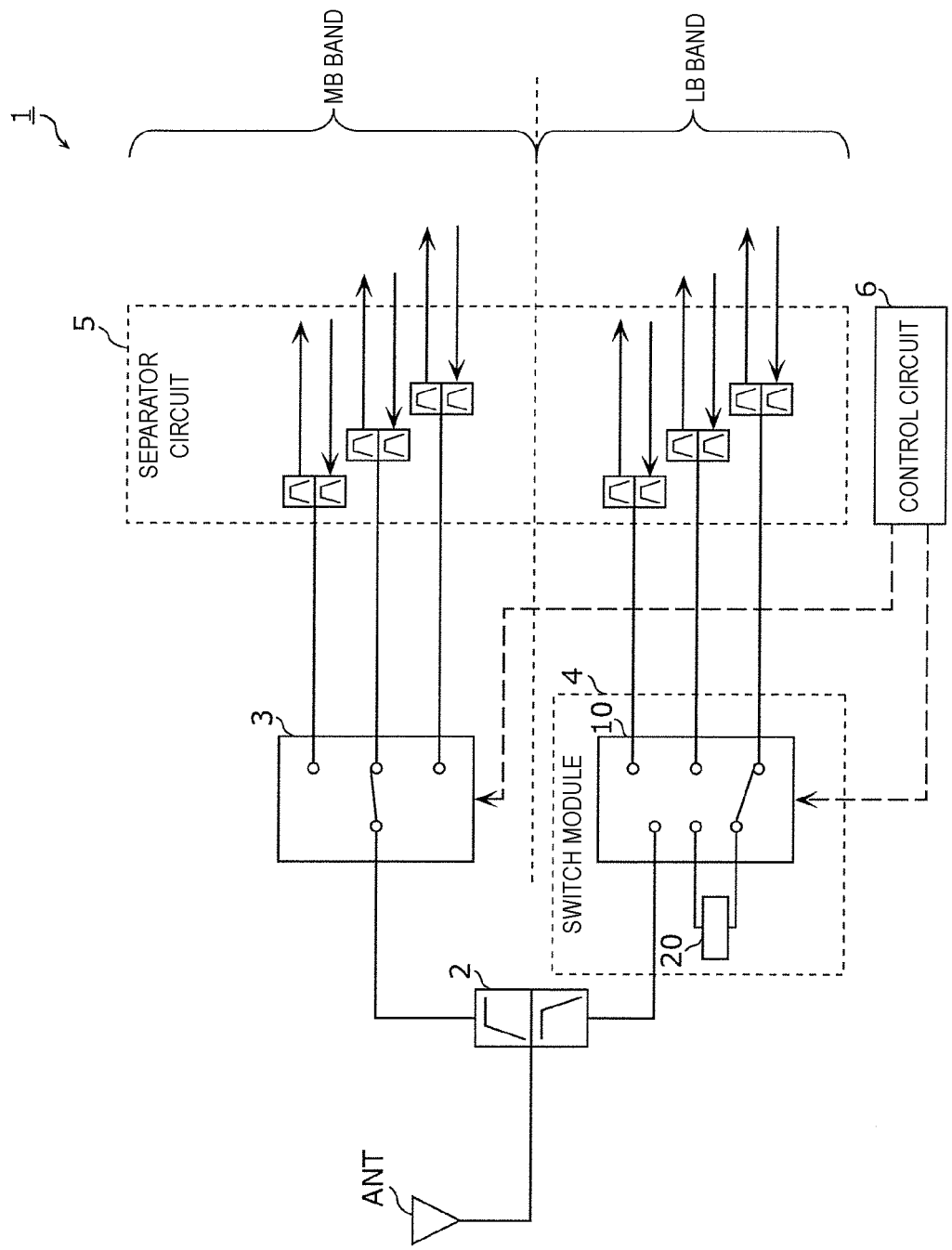
FIG. 1 is a block diagram of a front-end module according to a first preferred embodiment of the present invention.

FIG. 1 is a block diagram of a front-end module 1 according to a first preferred embodiment of the present invention.

The front-end module 1, which preferably is a multiband-support radio-frequency module, is preferably disposed in a front-end portion of a communication device, such as a cellular phone, for example. The front-end module 1 is connected to a multiband-support antenna ANT, for example.

The front-end module 1 transmits radio-frequency signals (sending signals or received signals) of predetermined bands between the antenna ANT and a signal processing circuit (not shown), such as a radio frequency integrated circuit (RFIC), which processes radio-frequency signals. The front-end module 1 supports a CA system in which radio-frequency signals of at least two bands are simultaneously sent or received. When CA communication is performed (in a CA mode), the front-end module 1 simultaneously sends or receives both a radio-frequency signal of a predetermined low-frequency band and a radio-frequency signal of a predetermined high-frequency band.

In the first preferred embodiment, the front-end module 1 preferably complies with a communication standard, such as Long Term Evolution (LTE), for example. The front-end module 1 transmits radio-frequency signals of three bands which belong to an LTE-standard low frequency band group (a band group of about 800 MHz to about 900 MHz, that is, a low band (hereinafter called the "LB band")) and radio-frequency signals of three bands which belong to an LTE-standard high frequency band group (a band group of about 1700 MHz to about 2000 MHz, that is, a middle band (hereinafter called the "MB band")), which is higher than the low frequency band group. When CA communication is not performed (in a non-CA mode), the front-end module 1 transmits a radio-frequency signal of one of the bands in the LB band and the MB band. In the CA mode, the front-end module 1 transmits a radio-frequency signal of one of the bands in the LB band and a radio-frequency signal of one of the bands in the MB band.

In the first preferred embodiment, the front-end module 1 preferably supports three bands in the LB band and three bands in the MB band, for example. However, this is only an example. The front-end module 1 may support one, two, or four or more bands in each of the LB band and the MB band. The number of bands in the LB band and that in the MB band supported by the front-end module 1 may be different.

As shown in FIG. 1, the front-end module 1 preferably includes a diplexer 2, switch modules 3 and 4, a separator circuit 5, and a control circuit 6 in this order from the side of the antenna ANT.

The antenna ANT is preferably a multiband-support antenna which complies with a communication standard such as LTE. The antenna ANT may not necessarily support all of the bands supported by the front-end module 1. In this case, the antenna ANT may be provided for a low frequency band group (LB band in the first preferred embodiment) and another antenna may be provided for a high frequency band group (MB band in the first preferred embodiment), for example.

The diplexer 2 is preferably a separator that separates radio-frequency signals higher than a predetermined frequency from those equal to or lower than the predetermined frequency. In the first preferred embodiment, the diplexer 2 separates MB-band radio-frequency signals and LB-band radio-frequency signals from each other. The diplexer 2 transmits MB-band radio-frequency signals between the antenna ANT and the switch module 3 and transmits LB-band radio-frequency signals between the antenna ANT and the switch module 4.

The switch module 3 is preferably an MB-band switch module in which the connection mode is switched in accordance with a control signal from the control circuit 6. The switch module 3 is preferably a Single-Pole n-Throw (SPnT) (n is the number of bands in the MB band) radio-frequency switch IC, for example.

The switch module 4 is an LB-band switch module in which the connection mode is switched in accordance with a control signal from the control circuit 6. The switch module 4 preferably includes a switch circuit 10 and a filter 20. Details of the switch module 4 will be discussed later.

The separator circuit 5 separates a sending signal and a received signal from each other. The separator circuit 5 is preferably defined by duplexers, for example. In the first preferred embodiment, the separator circuit 5 separates a sending signal and a received signal for each band in the MB band and for each band in the LB band.

The control circuit 6 outputs a control signal to control the switch modules 3 and 4 to switch the connection modes of the switch modules 3 and 4. More specifically, the control circuit 6 causes the switch circuit 10 to be in a first connection mode when CA communication is not performed, while the control circuit 6 causes the switch circuit 10 to be in a second connection mode when CA communication is performed. Details of the first and second connection modes of the switch circuit 10 will be discussed in detail later together with an explanation of the switch module 4. The control circuit 6 may be provided as an independent control IC, or may be integrated within a RFIC (Radio Frequency Integrated Circuit, not shown). Alternatively, the control circuit 6 may be integrated within the switch module 3 or 4.

Details of the switch module 4 will be discussed with reference to FIGS. 2A and 2B.

Figure 2A:
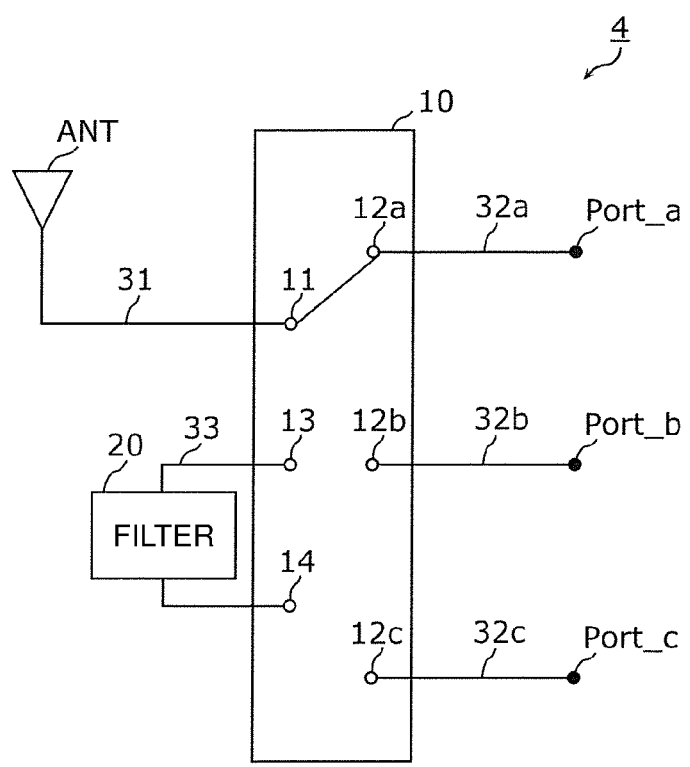
FIG. 2A is a block diagram illustrating a state in which a switch module according to the first preferred embodiment is in a non-CA mode.

FIG. 2A is a block diagram illustrating a state in which the switch module 4 according to the first preferred embodiment is in the non-CA mode (first connection mode). FIG. 2B is a block diagram illustrating a state in which the switch module 4 according to the first preferred embodiment is in the CA mode (second connection mode). For easy understanding of the connection relationships among the terminals of the switch module 4, the antenna ANT connected to the switch module 4 (via the diplexer 2 in the first preferred embodiment) is also shown in FIGS. 2A and 2B. The antenna ANT is also shown in the other block diagrams.

Figure 2B:
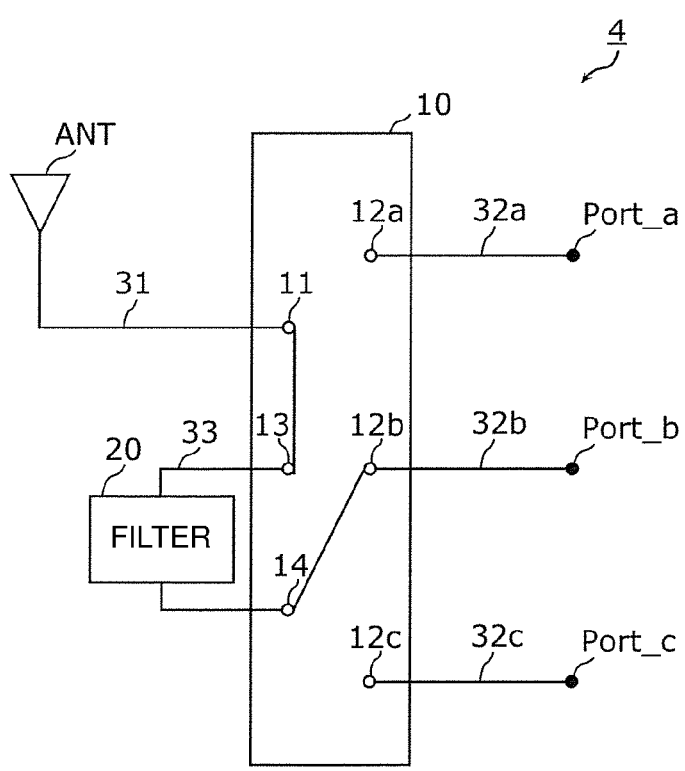
FIG. 2B is a block diagram illustrating a state in which the switch module according to the first preferred embodiment is in the CA mode.

As shown in FIGS. 2A and 2B, the switch module 4 includes the switch circuit 10 and the filter 20. The connection mode of the switch circuit 10 differs in accordance with whether the switch module 4 is in the non-CA mode or in the CA mode.

The switch circuit 10 preferably includes a common terminal 11, two or more (for example, three in the first preferred embodiment) selection terminals 12a, 12b, and 12c, and first and second bypass terminals 13 and 14. The switch circuit 10 is selectively switched between the first connection mode and the second connection mode. In the first connection mode, the common terminal 11 is connected to one of the selection terminals 12a, 12b, and 12c. In the second connection mode, the common terminal 11 is connected to the first bypass terminal 13, and the second bypass terminal 14 is connected to any of the selection terminals 12a, 12b, and 12c. The first and second connection modes are switched in accordance with a control signal from the control circuit 6. More specifically, the switch circuit 10 is in the first connection mode when CA is not being performed, while the switch circuit 10 is in the second connection mode when CA is being performed.

The common terminal 11 is provided for all the selection terminals 12a, 12b, and 12c, and is connected to the antenna ANT via a transmit path 31. The common terminal 11 is connectable to the selection terminals 12a, 12b, and 12c and the first bypass terminal 13. In the first preferred embodiment, the common terminal 11 is selectively connected to one of the selection terminals 12a, 12b, and 12c or the first bypass terminal 13. That is, when the common terminal 11 is connected to one of the selection terminals 12a, 12b, and 12c, it is not connected to the first bypass terminal 13. When the common terminal 11 is connected to the first bypass terminal 13, it is not connected to any of the selection terminals 12a, 12b, and 12c.

The common terminal 11 may be connected to the antenna ANT via a matching circuit that provides matching between the common terminal 11 and the antenna ANT.

The selection terminals 12a, 12b, and 12c correspond to different bands, and to those in the LB band in the first preferred embodiment. More specifically, the selection terminals 12a, 12b, and 12c are respectively connected to terminals Port_a, Port_b, and Port_c, which are input-and-output terminals for radio-frequency signals of the individual bands, via transmit paths 32a, 32b, and 32c. The selection terminals 12a, 12b, and 12c are switchable to be connected to the common terminal 11 and the second bypass terminal 14. More specifically, the selection terminals 12a, 12b, and 12c are mutually exclusively connected to the common terminal 11 or the second bypass terminal 14 in a changeable manner.

The first bypass terminal 13 defines and functions as one end of a bypass path 33 and is connectable to the common terminal 11.

The second bypass terminal 14 is provided for all the selection terminals 12a, 12b, and 12c. The second bypass terminal 14 defines and functions as the other end of the bypass path 33 and is connectable to the selection terminals 12a, 12b, and 12c.

In the switch circuit 10 configured as described above, connections among the terminals are switched in accordance with a control signal from the control circuit 6 disposed outside the switch circuit 10. The connections among the terminals include the connection between the common terminal 11 and one of the selection terminals 12a, 12b, and 12c, the connection between the common terminal 11 and the first bypass terminal 13, and the connection between the second bypass terminal 14 and any of the selection terminals 12a, 12b, and 12c. Switching timings of the connections among the terminals are not limited to a particular timing. If all the timings are synchronized with each other, fewer control lines are required to transmit control signals from the control circuit 6 to the switch circuit 10, and fewer control terminals are required in the switch circuit 10 accordingly.

The switch circuit 10 is preferably provided by circuitry, such as in a one-chip radio-frequency switch IC, for example. The terminals of the switch circuit 10 (such as the common terminal 11, selection terminals 12a, 12b, and 12c, first and second bypass terminals 13 and 14, and control terminals) are preferably, for example, surface electrodes (pads) or lead terminals disposed on the radio-frequency switch IC.

The switch circuit 10 may be integrated within the same IC package as the MB-band switch module 3 if desirable. However, in terms of enhancing the isolation between the LB band and the MB band, the switch circuit 10 and the MB-band switch module 3 are preferably provided on different semiconductor substrates, and more preferably, are integrated within different IC packages. On the other hand, however, in terms of saving the space of the mounting area for components, the switch circuit 10 and the MB-band switch module 3 are preferably integrated within the same IC package, and more preferably, they are provided on the same semiconductor substrate. The configurations of the switch circuit 10 and the switch module 3 may be determined suitably in accordance with the demanded electrical characteristics, layout limitations, etc.

The filter 20 is connected between the first and second bypass terminals 13 and 14. The filter 20 is a LPF, for example, which reduces harmonics of a radio-frequency signal passing through the filter 20. More specifically, concerning a combination of a band in the MB band and a band in the LB band which are used for CA communication, if the frequencies of harmonics of a radio-frequency signal of the band in the LB band are included in the band of the MB band, the filter 20 reduces such harmonics. For example, the filter 20 allows a radio-frequency signal of the band in the LB band to pass therethrough and attenuates second harmonics or third harmonics of this radio-frequency signal.

Harmonics to be reduced by the filter 20 may be both of second harmonics and third harmonics of a band in the LB band, or may be one of second harmonics and third harmonics. That is, harmonics to be reduced by the filter 20 (namely, harmonics within the attenuation band of the filter 20) may be determined suitably by the relationship between the frequency of a band in the MB band and that in the LB band (in particular, the receive band of the MB band and the transmit band of the LB band) simultaneously sent or received in the CA mode.

The filter 20 is preferably an LC filter including an inductor and a capacitor, for example, and provides an attenuation pole defined by the constants of the inductor and the capacitor within a band in the MB band sent or received in the CA mode. The number of stages of the LC resonance filters of the filter 20 (that is, the number of attenuation poles) is not restricted to a particular number, and may be determined suitably in accordance with the bandwidth of a demanded attenuation band.

In the first preferred embodiment, the filter 20 also defines and functions as a matching circuit for the switch circuit 10 in the second connection mode. For example, the filter 20 is suitably designed so that the impedance of the switch circuit 10 in the second connection mode seen from the antenna ANT will be a predetermined value of impedance, about 50Ω, for example.

The filter 20 is not restricted to a LPF, and may be a band pass filter (BPF) using a band in the LB band as a pass band or a band elimination filter (BEF) using a band in the MB band as an attenuation band. The filter 20 is not restricted to a LC filter, and may be a dielectric filter or a surface acoustic wave (SAW) filter.

The switch module 4 configured as described above operates in the following manner in accordance with a control signal.

As shown in FIG. 2A, in the switch circuit 10 in the non-CA mode, the common terminal 11 is connected to one of the selection terminals 12a, 12b, and 12c (selection terminal 12a in FIG. 2A) (first connection mode). With this configuration, a radio-frequency signal in the LB band (sending signal in this example) input from the terminal Port_a does not pass through the filter 20 but is output from the common terminal 11 to the antenna ANT.

As shown in FIG. 2B, in the switch circuit 10 in the CA mode, the common terminal 11 is connected to the first bypass terminal 13, and also, the second bypass terminal 14 is connected to any of the selection terminals 12a, 12b, and 12c (selection terminal 12b in FIG. 2B) (second connection mode). With this configuration, a radio-frequency signal in the LB band (sending signal in this example) input from the terminal Port_b passes through the filter 20 and is output from the common terminal 11 to the antenna ANT.

The selection terminal connected to the common terminal in the non-CA mode and that connected to the second bypass terminal 14 in the CA mode are not restricted to the selection terminals 12a, 12b, and 12c, as shown in FIGS. 2A and 2B. Instead, the selection terminals are selected suitably in accordance with the band to be transmitted. Although one selection terminal is connected to the second bypass terminal 14 in the CA mode in FIG. 2B, plural selection terminals may be connected to the second bypass terminal 14.

The switch module 4 according to the first preferred embodiment has been discussed. Advantages achieved by the switch module 4 will be described below in comparison with a comparative example of the first preferred embodiment.

Figure 3:
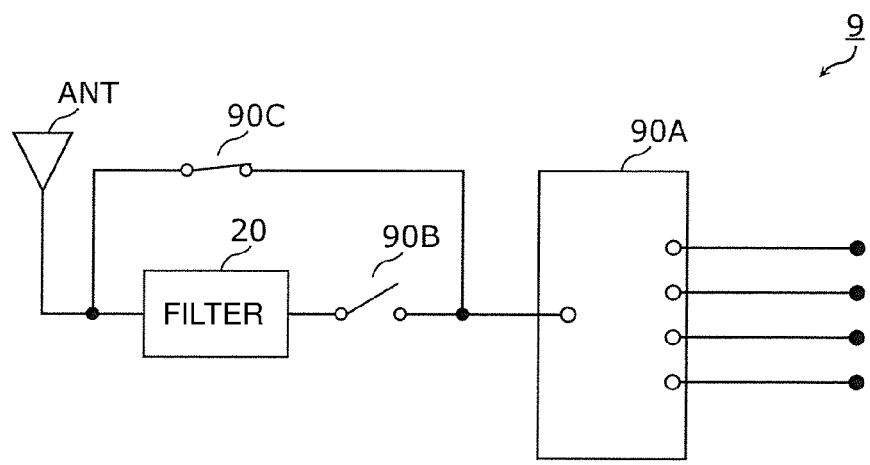
FIG. 3 is a block diagram illustrating a state in which a switch module according to a comparative example is in the non-CA mode.

The comparative example will first be described below with reference to FIG. 3. FIG. 3 is a block diagram illustrating a state in which a switch module 9 according to the comparative example is in the non-CA mode.

The switch module 9 differs from the switch module 4 of the first preferred embodiment shown in FIGS. 2A and 2B in that it includes a SPnT (n is the number of bands in the LB band) switch circuit 90A and Single-Pole Single-Throw (SPST) switch circuits 90B and 90C, instead of the switch circuit 10. The switch circuit 90B is disposed on a transmission line which passes through the filter 20 between the antenna ANT and the switch circuit 90A. The switch circuit 90C is disposed on a bypass path which bypasses the filter 20 between the antenna ANT and the switch circuit 90A.

In the switch module 9 configured as described above, the switch circuit 90B is OFF and the switch circuit 90C is ON in the non-CA mode, while the switch circuit 90B is ON and the switch circuit 90C is OFF in the CA mode. In the non-CA mode, a radio-frequency signal is transmitted without passing through the filter 20, and the insertion loss is thus unlikely to increase. In the CA mode, a radio-frequency signal is transmitted via the filter 20, which may reduce defects, such as degradation of the receiving sensitivity caused by harmonics.

In the switch module 9 configured as described above, however, in the non-CA mode, a radio-frequency signal is transmitted via two switch circuits (switch circuits 90A and 90C). Although an increase in the insertion loss caused by the filter 20 may be avoided in the non-CA mode, the filter circuit 90C disposed on the bypass path which bypasses the filter 20 may increase the insertion loss.

In contrast, in the switch module 4 of the first preferred embodiment, the switch circuit 10 is selectively switched between the first connection mode and the second connection mode. In the first connection mode, the common terminal 11 is connected to one of two or more selection terminals 12a, 12b, and 12c (for example, three in the first preferred embodiment) (see FIG. 2A). In the second connection mode, the common terminal 11 is connected to the first bypass terminal 13, and the second bypass terminal 14 is connected to any of the selection terminals 12a, 12b, and 12c (see FIG. 2B).

In the first connection mode, a radio-frequency signal is transmitted without passing through the filter 20, and the insertion loss is thus unlikely to increase. In the second connection mode, a radio-frequency signal is transmitted via the filter 20, thus making it possible to reduce harmonics of this radio-frequency signal. The switch circuit 10 is in the second connection mode when CA communication is being performed, while the switch circuit 10 is in the first connection mode when CA communication is not being performed. It is thus less likely to increase the insertion loss in the non-CA mode while achieving desired characteristics in the CA mode by reducing defects, such as degradation of the receiving sensitivity caused by a leakage of harmonics.

This will now be explained more specifically. In the switch module 9 of the comparative example, a radio-frequency signal is transmitted via the two switch circuits 90A and 90C in the non-CA mode. In contrast, in the switch module 4 of the first preferred embodiment, a radio-frequency signal is transmitted only via the single switch circuit 10 in the non-CA mode. An increase in the insertion loss is less likely to occur in the non-CA mode by using the switch module 4 than by the switch module 9.

The filter 20 is connected between the first and second bypass terminals 13 and 14. In the second connection mode, a radio-frequency signal is thus transmitted via the filter 20 regardless of with which selection terminal the second bypass terminal 14 is connected. This eliminates the need to provide as many filters as the selection terminals 12a, 12b, and 12c (that is, as many filters as the bands), thus saving the space of the switch module 4.

By using the switch module 4 according to the first preferred embodiment, it is less likely to increase the insertion loss in the non-CA mode while achieving desired characteristics in the CA mode and also saving the space of the switch module 4.

A radio-frequency module (front-end module 1 in the first preferred embodiment) includes the above-described switch module 4 and the control circuit 6 that causes the switch circuit 10 to be in the first connection mode when CA communication is not performed (non-CA mode) and causes the switch circuit 10 to be in the second connection mode when CA communication is performed (CA mode).

It is thus possible to implement a space-saving radio-frequency module which is less likely to increase the insertion loss in the non-CA mode while achieving desired characteristics in the CA mode.

The configurations of the switch module 4 and the surrounding elements are not restricted to those in the first preferred embodiment. Modified examples of the switch module 4 and the surrounding elements will be described below. Elements similar to those of the first preferred embodiment are designated by like reference numerals, and an explanation thereof may be omitted.

First Modified Example of First Preferred Embodiment

Details of a switch module 4A according to a first modified example of the first preferred embodiment will be described below with reference to FIGS. 4A and 4B.

Figure 4A:
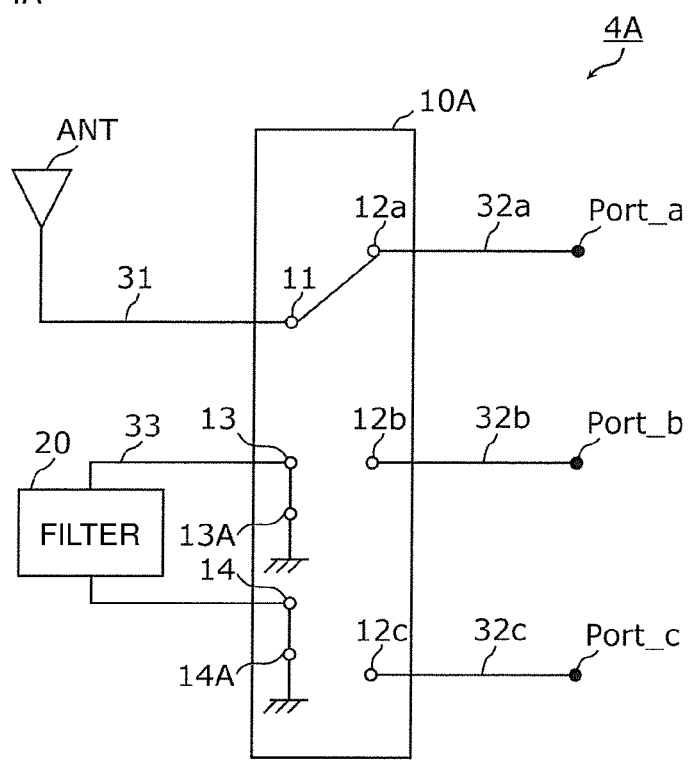
FIG. 4A is a block diagram illustrating a state in which a switch module according to a first modified example of the first preferred embodiment is in the non-CA mode.

FIG. 4A is a block diagram illustrating a state in which the switch module 4A according to the first modified example is in the non-CA mode (first connection mode). FIG. 4B is a block diagram illustrating a state in which the switch module 4A according to the first modified example is in the CA mode (second connection mode).

As shown in FIG. 4A, in the switch module 4A in the first connection mode, at least one of the first and second bypass terminals 13 and 14 (both in the first modified example) is connected to a ground.

More specifically, the switch module 4A differs from the switch module 4 shown in FIGS. 2A and 2B in that it includes a switch circuit 10A including ground terminals 13A and 14A, instead of the switch circuit 10.

The ground terminals 13A and 14A are respectively provided in association with the first and second bypass terminals 13 and 14, and are connected to a ground. The configurations of the ground terminals 13A and 14A are similar to each other, except that the ground terminals 13A and 14A are respectively connected to the different first and second bypass terminals 13 and 14. Hereinafter, the ground terminal 13A will mainly be discussed, and an explanation of the ground terminal 14A will be omitted unless it is necessary.

The switch module 4A configured as described above operates in the following manner in accordance with a control signal.

As shown in FIG. 4A, in the switch circuit 10A in the non-CA mode, the common terminal 11 is connected to one of the selection terminals 12a, 12b, and 12c (selection terminal 12a in FIG. 4A), and the first and second bypass terminals 13 and 14 are connected to the associated ground terminals 13A and 14A (first connection mode).

Figure 4B:
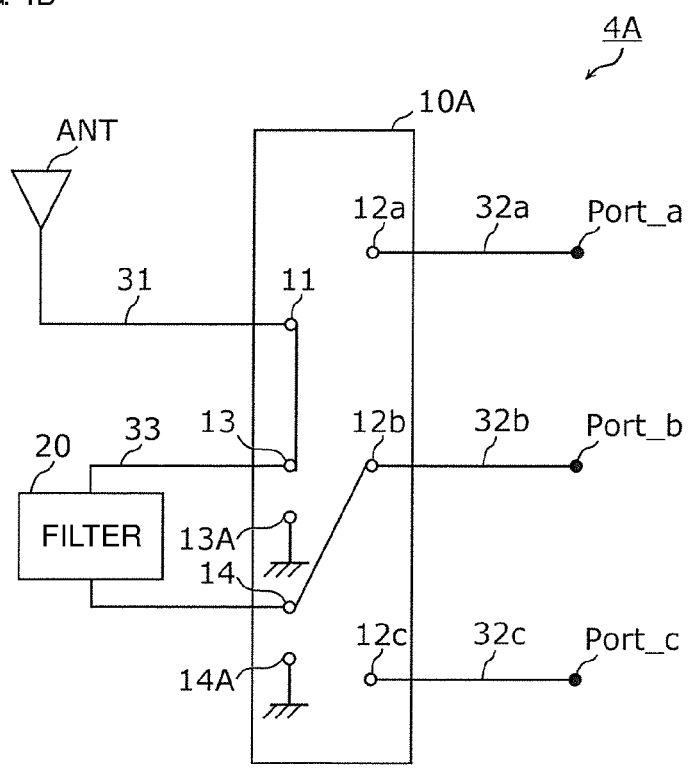
FIG. 4B is a block diagram illustrating a state in which the switch module according to the first modified example of the first preferred embodiment is in the CA mode.

As shown in FIG. 4B, in the switch circuit 10A in the CA mode, the common terminal 11 is connected to the first bypass terminal 13, and also, the second bypass terminal 14 is connected to any of the selection terminals 12a, 12b, and 12c (selection terminal 12b in FIG. 4B) (second connection mode). The ground terminals 13A and 14B are not connected to the first and second bypass terminals 13 and 14.

In the switch module 4A according to the first modified example, the switch circuit 10A is selectively switched between the first connection mode (see FIG. 4A) and the second connection mode (see FIG. 4B). Advantages similar to those of the first preferred embodiment are thus achieved.

In the switch module 4A, in the first connection mode, at least one of the first and second bypass terminals 13 and 14 (both in the first modified example) is connected to a ground.

It is thus possible to enhance the electrical isolation between a path through which a radio-frequency signal is transmitted (path including the transmission line 32a, the selection terminal 12a, the common terminal 11, and the transmission line 31 in FIG. 4A) and the filter 20 in the first connection mode. That is, the electrical isolation between a so-called "HOT" transmission line and the filter 20 is enhanced. It is thus possible to reduce the influence (impedance vs. frequency characteristics, for example) of the filter 20 on a radio-frequency signal in the non-CA mode.

In the first connection mode, both of the first and second bypass terminals 13 and 14 are preferably connected to a ground in order to enhance the isolation. However, the connection of only one of the first and second bypass terminals 13 and 14 to a ground may suffice.

Second Modified Example of First Preferred Embodiment

Details of a switch module 4B according to a second modified example of the first preferred embodiment will be described below with reference to FIG. 5.

Figure 5:
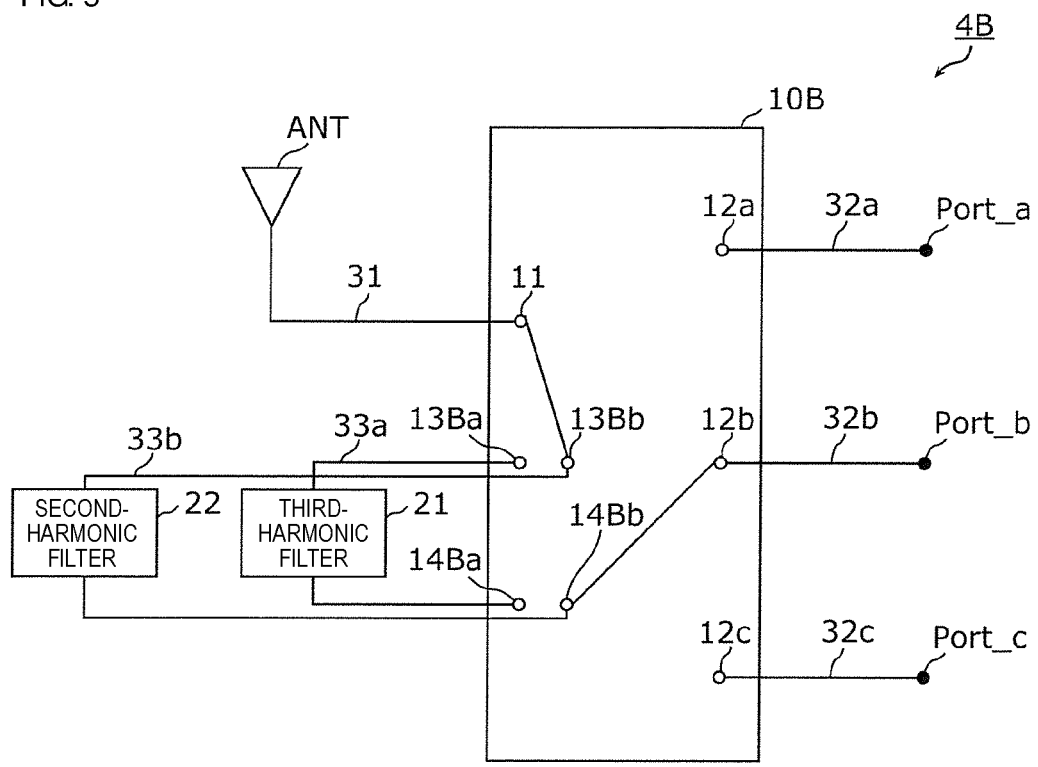
FIG. 5 is a block diagram illustrating a state in which a switch module according to a second modified example of the first preferred embodiment is in the CA mode.

FIG. 5 is a block diagram illustrating a state in which the switch module 4B according to the second modified example is in the CA mode (second connection mode). The state in which the switch module 4B is in the non-CA mode (first connection mode) is not shown. In the non-CA mode, the common terminal 11 is connected to one of the selection terminals 12a, 12b, and 12c, as in the first preferred embodiment and the first modified example.

As shown in FIG. 5, the switch module 4B differs from the switch module 4 shown in FIGS. 2A and 2B in that it includes, instead of the filter 20, plural filters (a third-harmonic filter 21 and a second-harmonic filter 22 in the second modified example) which are mutually exclusively selected and which reduce different orders of harmonics. These plural filters are selected in accordance with a control signal from the control circuit 6, for example.

The third-harmonic filter 21 reduces third harmonics of a radio-frequency signal (sending signal in a band of the LB band in this example) passing through the third-harmonic filter 21. The third-harmonic filter 21 is a BEF, such as a notch filter. In the second modified example, the third-harmonic filter 21 is connected between first and second bypass terminals 13Ba and 14Ba, which will be discussed later.

The second-harmonic filter 22 reduces second harmonics of a radio-frequency signal (sending signal in a band of the LB band in this example) passing through the second-harmonic filter 22. The second-harmonic filter 22 is preferably a BEF, such as a notch filter. In the second modified example, the second-harmonic filter 22 is connected between first and second bypass terminals 13Bb and 14Bb, which will be discussed later.

The number of filters and the orders of harmonics to be reduced are not limited to those in the second modified example, and may be determined suitably in accordance with the relationship between the frequencies of bands used for CA communication.

In the second modified example, two bypass paths 33a and 33b are provided to mutually exclusively select the third-harmonic filter 21 or the second-harmonic filter 22 as a filter for reducing harmonics. Instead of the switch circuit 10, a switch circuit 10B including the two first bypass terminals 13Ba and 13Bb and the two second bypass terminals 14Ba and 14Bb is thus provided.

The switch module 4B configured as described above operates in the CA mode in the following manner in accordance with a control signal. The operation of the switch module 4B in the non-CA mode is similar to that of the first preferred embodiment, and an explanation thereof will be omitted.

As shown in FIG. 5, in the switch circuit 10B in the CA mode, the common terminal 11 is connected to one of the first bypass terminals 13Ba and 13Bb (first bypass terminal 13Bb in FIG. 5), and also, one of the second bypass terminals 14Ba and 14Bb (second bypass terminal 14Bb in FIG. 5) is connected to any of the selection terminals 12a, 12b, and 12c (selection terminal 12b in FIG. 5) (second connection mode). With this configuration, a radio-frequency signal in the LB band input from the terminal Port_b passes through the bypass path 33b and is output to the antenna ANT. That is, this radio-frequency signal is output via the second-harmonic filter 22.

The first bypass terminal 13Ba or 13Bb connected to the common terminal 11 and the second bypass terminal 14Ba or 14Bb connected to any of the selection terminals 12a, 12b, and 12c correspond to one of the third-harmonic filter 21 and the second-harmonic filter 22 which is selected as a filter for allowing the radio-frequency signal to pass therethrough by reducing harmonics.

In the switch module 4B according to the second modified example, the switch circuit 10B is selectively switched between the first connection mode (not shown) and the second connection mode (see FIG. 5). Advantages similar to those of the first preferred embodiment are thus achieved.

The switch module 4B includes plural filters which are mutually exclusively selected and reduce different orders of harmonics (third-harmonic filter 21 and second-harmonic filter 22 in the second modified example).

Usually, a filter reducing a higher order of harmonics achieves a smaller insertion loss. In the second connection mode, a suitable filter is selected among plural filters in accordance with the order of harmonics required to be reduced, thus making it possible to reduce the insertion loss while suppressing harmonics. A suitable filter is selected in accordance with the relationship between the frequency of a band in a high-frequency band and that in a low-frequency band (in particular, the receive band of the high-frequency band and the transmit band of the low-frequency band) simultaneously sent or received in the CA mode. This makes it possible to reduce the insertion loss in the low-frequency band while avoiding degradation of the receiving sensitivity in the high-frequency band.

The specific number of filters and the orders of harmonics to be reduced are not limited to those in the second modified example. For example, three filters which reduce the third through fifth harmonics may be provided.

The configuration of the switch module 4B according to the second modified example is not restricted to that using the switch circuit 10B. The switch module 4B may include the switch circuit 10 and a Single-Pole Double-Throw (SPDT) selection switch to mutually exclusively select the third-harmonic filter 22 or the second-harmonic filter 21. In this configuration, however, a radio-frequency signal passes through this selection switch in the second connection mode, which is more likely to increase the insertion loss than in the switch module 4B. In terms of avoiding an increase in the insertion loss, the configuration of the switch module 4B is more preferable.

Third Modified Example of First Preferred Embodiment

Details of a switch module 4C according to a third modified example of the first preferred embodiment will be described below with reference to FIGS. 6A and 6B.

Figure 6A:
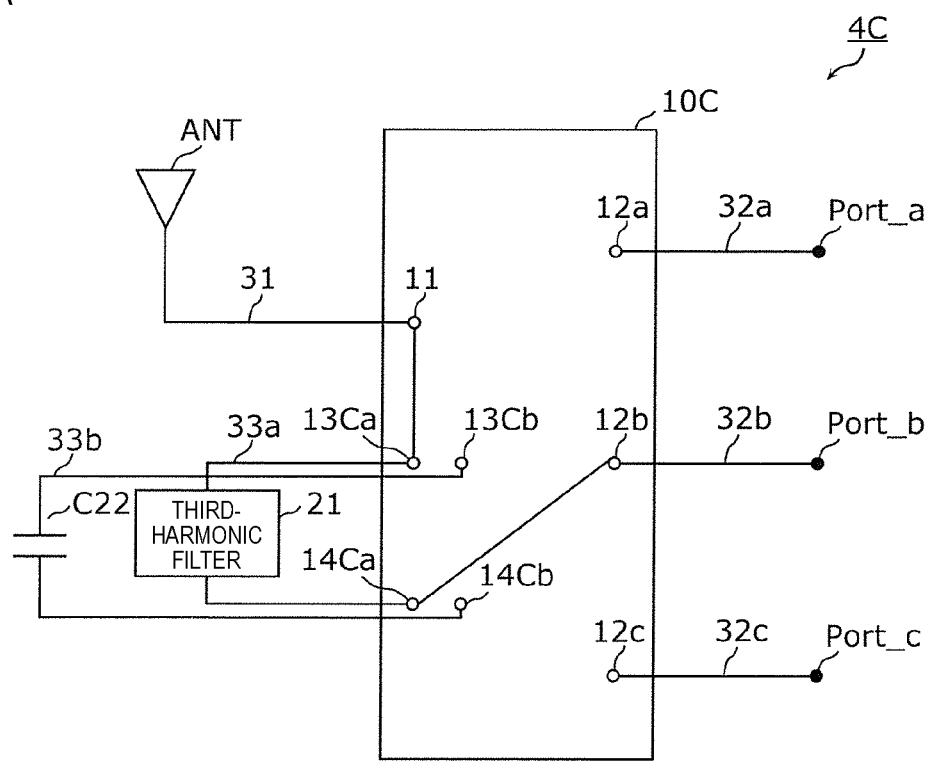
FIG. 6A is a block diagram illustrating a state in which a switch module according to a third modified example of the first preferred embodiment is in a first state of the CA mode.

FIG. 6A is a block diagram illustrating a state in which the switch module 4C according to the third modified example is in a first state of the CA mode (first state of the second connection mode). FIG. 6B is a block diagram illustrating a state in which the switch module 4C according to the third modified example is in a second state of the CA mode (second state of the second connection mode).

Figure 6B:
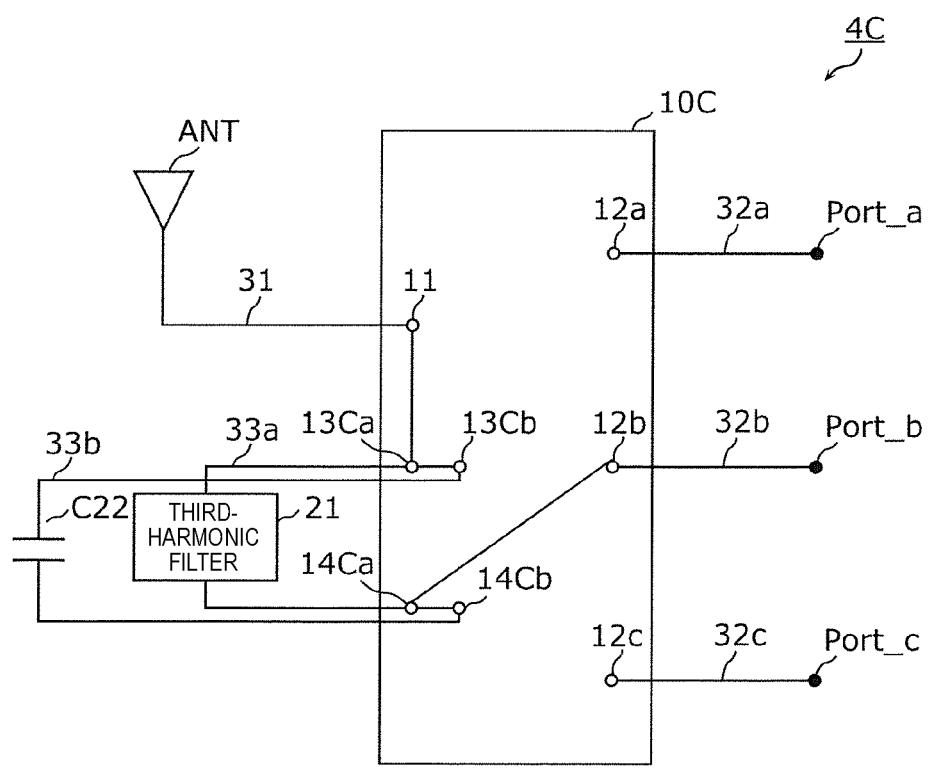
FIG. 6B is a block diagram illustrating a state in which the switch module according to the third modified example of the first preferred embodiment is in a second state of the CA mode.

As shown in FIGS. 6A and 6B, the switch module 4C differs from the switch module 4B shown in FIG. 5 in that it includes a capacitor C22 selectively connected in parallel with the third-harmonic filter 21, instead of the second-harmonic filter 22.

The capacitor C22 is connected in parallel with the third-harmonic filter 21 so as to define, together with the third-harmonic filter 21, a filter exhibiting characteristics different from those of the single third-harmonic filter 21. More specifically, the capacitor C22 and the third-harmonic filter 21 connected in parallel with each other define and function as a notch filter which provides an attenuation pole in a frequency lower than that provided by the single third-harmonic filter 21. In the third modified example, the notch filter reduces second harmonics of a radio-frequency signal of a band in the LB band sent or received in the CA mode.

In the third modified example, the third-harmonic filter is in series with the bypass path 33a connecting first and second bypass terminals 13Ca and 14Ca. The third-harmonic filter 21 is a LC parallel resonance filter including an inductor and a capacitor connected in parallel with each other. That is, the capacitor C22 is in parallel with the LC parallel resonance filter, and is selectively connected in parallel with the LC parallel resonance filter when the common terminal 11 is connected to the first bypass terminal 13Ca. The common terminal 11 and the LC parallel resonance filter are selectively connected in parallel with each other in accordance with a control signal from the control circuit 6, for example.

Figure 7:
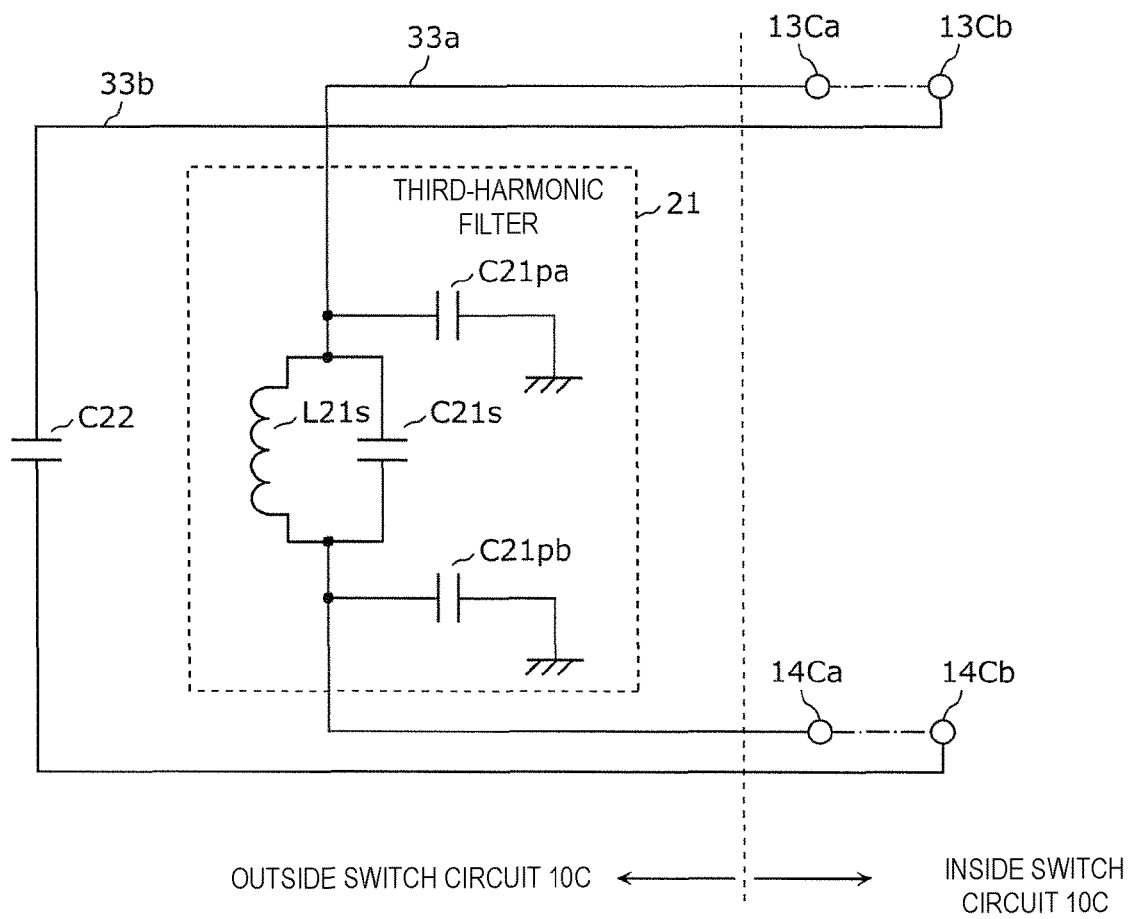
FIG. 7 is a circuit diagram illustrating the configuration of a capacitor and a LC parallel resonance filter according to the third modified example of the first preferred embodiment, together with the connection relationship with surrounding elements.

FIG. 7 is a circuit diagram illustrating the configuration of the capacitor C22 and the LC parallel resonance filter (i.e., the third-harmonic filter 21), together with the connection relationship with surrounding elements.

As shown in FIG. 7, the third-harmonic filter 21 includes a LC parallel resonance circuit is preferably provided by an inductor L21s and a capacitor C21s connected in series with the bypass path 33a and connected in parallel with each other. The third-harmonic filter 21 also includes capacitors C21pa and C21pb on both sides of the LC parallel resonance circuit. The capacitors C21pa and C21pb connect (shunt) the bypass path 33a and a ground.

The third-harmonic filter 21 configured as described above defines a first LC parallel resonance filter having a first frequency which is defined by the constants of the inductor L21s and the capacitor C21s as an attenuation pole (resonance point). In the third modified example, the first LC parallel resonance filter reduces third harmonics of a radio-frequency signal of a band in the LB band sent or received in the CA mode.

Connecting the first LC parallel resonance filter (in particular, the inductor L21s and the capacitor C21s) in parallel with the capacitor C22 forms a second LC parallel resonance filter. The attenuation pole (second frequency) provided by the second LC parallel resonance filter is different from that (first frequency) provided by the first LC parallel resonance filter. As the constant of the capacitor C22 is greater, the difference between the first frequency and the second frequency is greater. That is, changing of the constant of the capacitor C22 adjusts the frequency of the attenuation pole provided by the second LC parallel resonance filter.

In the third modified example, the two bypass paths 33a and 33b are provided to selectively connect the third-harmonic filter 21 and the capacitor C22 in parallel with each other. Instead of the switch circuit 10, a switch circuit 10C including two first bypass terminals 13Ca and 13Cb and two second bypass terminals 14Ca and 14Cb is thus provided.

The switch module 4C configured as described above operates in the CA mode in the following manner in accordance with a control signal. The operation of the switch module 4C in the non-CA mode is similar to that of the first preferred embodiment, and an explanation thereof will be omitted.

In the switch circuit 10C in the first state of the CA mode, as shown in FIG. 6A, the common terminal 11 is connected to the first bypass terminal 13Ca corresponding to the third-harmonic filter 21, and also, the second bypass terminal 14Ca corresponding to the third-harmonic filter 21 is connected to any of the selection terminals 12a, 12b, and 12c (selection terminal 12b in FIG. 6A) (first state of the second connection mode). With this configuration, a radio-frequency signal in the LB band input from the terminal Port_b passes through the bypass path 33a and is output to the antenna ANT. That is, this radio-frequency signal is output via the third-harmonic filter 21.

In the switch circuit 10C in the second state of the CA mode, as shown in FIG. 6B, the common terminal 11 is connected to the first bypass terminal 13Ca and the second bypass terminal 14Ca is connected to any of the selection terminals 12a, 12b, and 12c, as in the first state. Additionally, the first bypass terminals 13Ca and 13Cb are connected to each other, and the second bypass terminals 14Ca and 14Cb are connected to each other (second state of the second connection mode). With this configuration, a radio-frequency signal in the LB band input from the terminal Port_b passes through the bypass paths 33a and 33b and is output to the antenna ANT. That is, this radio-frequency signal is output via a filter defined by the LC parallel resonance filter (third-harmonic filter 21 in the third modified example) and the capacitor C22 connected in parallel with each other.

In the switch module 4C according to the third modified example, the switch circuit 10C is selectively switched between the first connection mode (not shown) and the second connection mode (see FIGS. 6A and 6B). Advantages similar to those of the first preferred embodiment are thus achieved.

The switch module 4C includes a LC parallel resonance filter (third-harmonic filter 21 in the third modified example) and the capacitor C22 selectively connected in parallel with the LC parallel resonance filter.

By connecting or disconnecting the capacitor C22 to or from the LC parallel resonance filter, the switch module 4C selectively enters the first state in which the first frequency is used as the attenuation pole or the second state in which the second frequency lower than the first frequency is used as the attenuation pole. This saves space in the switch module 4C, compared with a configuration in which plural filters having different attenuation poles are provided and one of them is selected in accordance with the frequency to be attenuated. Changing of the capacitance of the capacitor C22 adjusts the attenuation pole in the second state. As a result, the attenuation pole is able to be adjusted more precisely.

In the third modified example, the single capacitor C22 is connected in parallel with the third-harmonic filter 21. However, plural capacitors may be connected to the third-harmonic filter 21 if so desired. The attenuation pole of the filter defined by the capacitor and the third-harmonic filter 21 is not limited to the above-described frequency. The attenuation pole of the filter may be a frequency between second harmonics and third harmonics or may be a certain frequency within a third-harmonic broad band. Instead of the third-harmonic filter 21, the switch module 4C may include a filter that reduces another order of harmonics, such as the second-harmonic filter 22.

The capacitor C22 may be a variable capacitor, such as, for example, a varicap or a digitally tunable capacitor (DTC).

Fourth Modified Example of First Preferred Embodiment

In the first preferred embodiment and the first through third modified examples thereof, the MB-band switch module 3 and the LB-band switch module are provided separately (see FIG. 1). However, the MB-band switch module and the LB-band switch module may be provided as a single switch module. As a fourth modified example of the first preferred embodiment, such a switch module will be discussed below with reference to FIG. 8.

Figure 8:
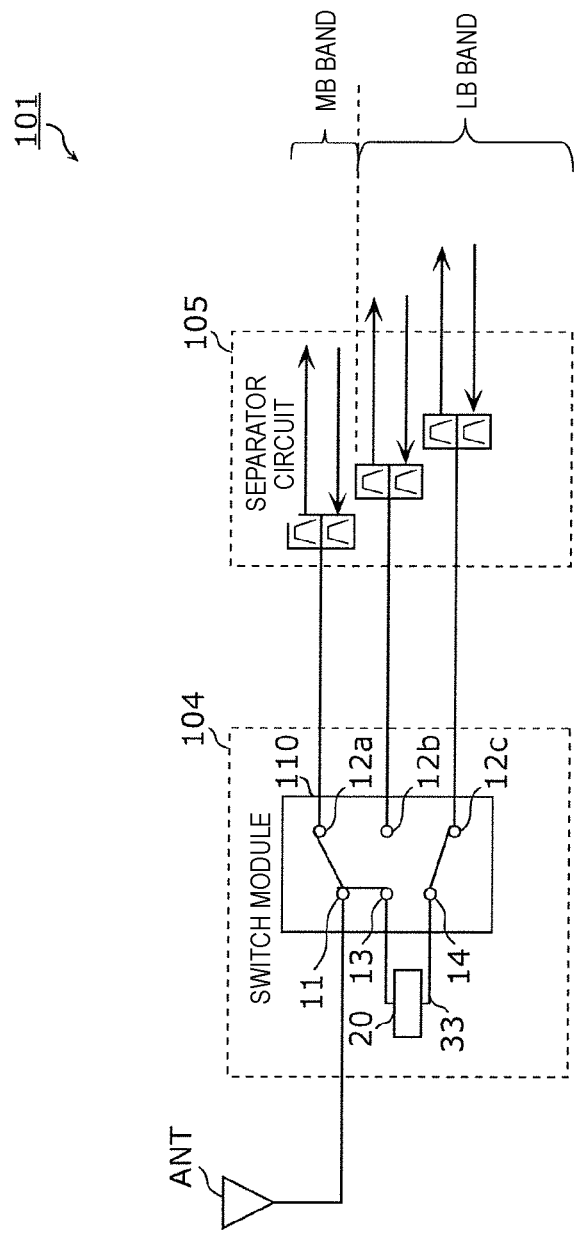
FIG. 8 is a block diagram of a front-end module according to a fourth modified example of the first preferred embodiment of the present invention.

FIG. 8 is a block diagram of a front-end module 101 including a switch module 104 according to the fourth modified example. A control circuit that controls the switch module 104 is not shown.

The front-end module 101 supports one band in the MB band and two bands in the LB band. As shown in FIG. 8, in the CA mode, the front-end module 101 transmits a radio-frequency signal in one band of the LB band and a radio-frequency signal in the band of the MB band. The front-end module 101 differs from the front-end module 1 shown in FIG. 1 in that it does not include the diplexer 2 and includes the switch module 104 instead of the switch modules 3 and 4 and a separator circuit 105 instead of the separator circuit 5. The separator circuit 105 is similar to the separator circuit 5, except that the number of duplexers is different because of a different number of bands, and a detailed explanation thereof will be omitted.

The switch module 104 is used for both of the MB band and the LB band. The switch module 104 differs from the switch module 4 in that it includes a switch circuit 110 instead of the switch circuit 10.

Since the switch circuit 110 is used for both of the MB band and the LB band, the connection relationships among the terminals of the switch circuit 110 in the second connection mode is different from those of the switch circuit 10. More specifically, in the second connection mode, the common terminal 11 is electrically connected to one of the selection terminals 12a, 12b, and 12c (selection terminal 12a in FIG. 8) which is different from the selection terminal (selection terminal 12c in FIG. 8) connected to the second bypass terminal 14.

The switch module 104 configured as described above operates in the following manner in accordance with a control signal.

In the non-CA mode, in the switch circuit 110 as well as in the switch circuit 10, the common terminal 11 is connected to one of the selection terminals 12a, 12b, and 12c (first connection mode). With this configuration, an input radio-frequency signal is output via a transmit path disconnected from a bypass path 33.

In the CA mode, in the switch circuit 110, as shown in FIG. 8, the common terminal 11 is connected to the first bypass terminal 13, and also, the second bypass terminal 14 is connected to any of the selection terminals 12a, 12b, and 12c (selection terminal 12c in FIG. 8) (second connection mode). With this configuration, a radio-frequency signal in the LB band (sending signal in this example) input from the selection terminal 12c passes through the filter 20 and is output from the common terminal 11 to the antenna ANT.

In the CA mode, in the switch circuit 110, the common terminal 11 is also connected to one of the selection terminals 12a, 12b, and 12c (selection terminal 12a in FIG. 8) which is different from the selection terminal (selection terminal 12c in FIG. 8) connected to the second bypass terminal 14. With this configuration, a radio-frequency signal in the MB band (sending signal in this example) input from the selection terminal 12a does not pass through the filter 20 but is output from the common terminal 11 to the antenna ANT.

In the switch module 104 according to the fourth modified example, the switch circuit 110 is selectively switched between the first connection mode (not shown) and the second connection mode (see FIG. 8). Advantages similar to those of the first preferred embodiment are thus achieved.

In the second connection mode, the common terminal 11 is also connected to one of the selection terminals 12a, 12b, and 12c different from the selection terminal connected to the second bypass terminal 14.

With this configuration, in the second connection mode, a radio-frequency signal transmitted via the selection terminal (selection terminal 12a in FIG. 8) connected to the common terminal 11 does not pass through the filter 20. In the second connection mode, if the selection terminal connected to the common terminal 11 corresponds to a high-frequency band (band in the MB band in the fourth modified example) and if the selection terminal connected to the second bypass terminal 14 corresponds to a low-frequency band (band in the LB band in the fourth modified example), a switch circuit for the high-frequency band and a switch circuit for the low-frequency band are able to be integrated into one switch circuit. This saves space in the switch module 104.

Second Preferred Embodiment

In the switch modules according to the first preferred embodiment and the first through fourth modified examples thereof, the filter 20 is preferably provided on the bypass path 33, for example. However, the circuit element provided on the bypass path 33 is not restricted to a filter, but may be a matching circuit. In a switch module used in a CA multiband-support communication system, there may be a disparity in impedance matching between when CA communication is performed and CA communication is not performed. That is, impedance mismatching may occur in the CA mode. To eliminate this impedance mismatching, a matching circuit may be provided on the bypass path 33. Such a switch module will be discussed in a second preferred embodiment of the present invention.

Figure 9A:
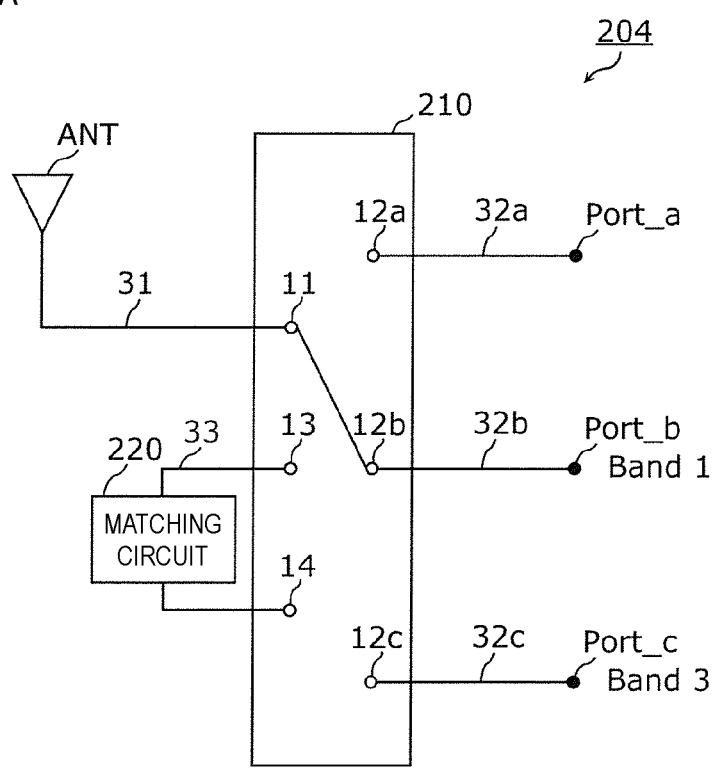
FIG. 9A is a block diagram illustrating a state in which a switch module according to a second preferred embodiment is in the non-CA mode.
Figure 9B:
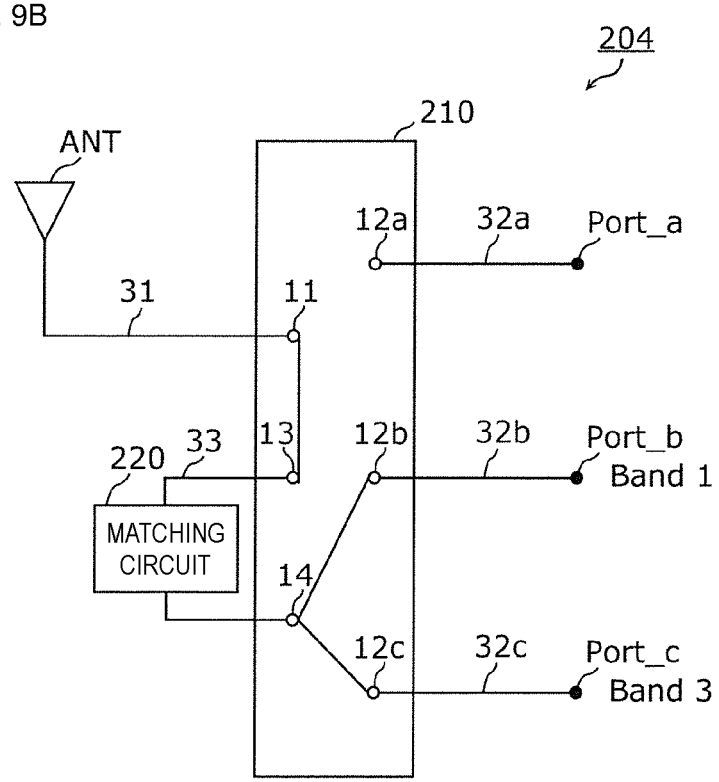
FIG. 9B is a block diagram illustrating a state in which the switch module according to the second preferred embodiment is in the CA mode.

FIG. 9A is a block diagram illustrating a state in which a switch module 204 according to the second preferred embodiment is in the non-CA mode (first connection mode). FIG. 9B is a block diagram illustrating a state in which the switch module 204 according to the second preferred embodiment is in the CA mode (second connection mode).

The switch module 204 differs from the switch module 4 shown in FIGS. 2A and 2B in that it includes a switch circuit 210 and a matching circuit 220 instead of the switch circuit 10 and the filter 20.

In the second connection mode, as shown in FIG. 9B, in the switch circuit 210, the second bypass terminal 14 is connected to two of the plural selection terminals 12a, 12b, and 12c, unlike the switch circuit 10.

The matching circuit 220 is connected between the first and second bypass terminals 13 and 14 and reduces impedance mismatching in the switch circuit 210 in the second connection mode. For example, the matching circuit 220 is suitably designed so that the impedance of the switch circuit 210 in the second connection mode seen from the antenna ANT will be a predetermined value of impedance, about 50 SΩ, for example.

Figure 10:
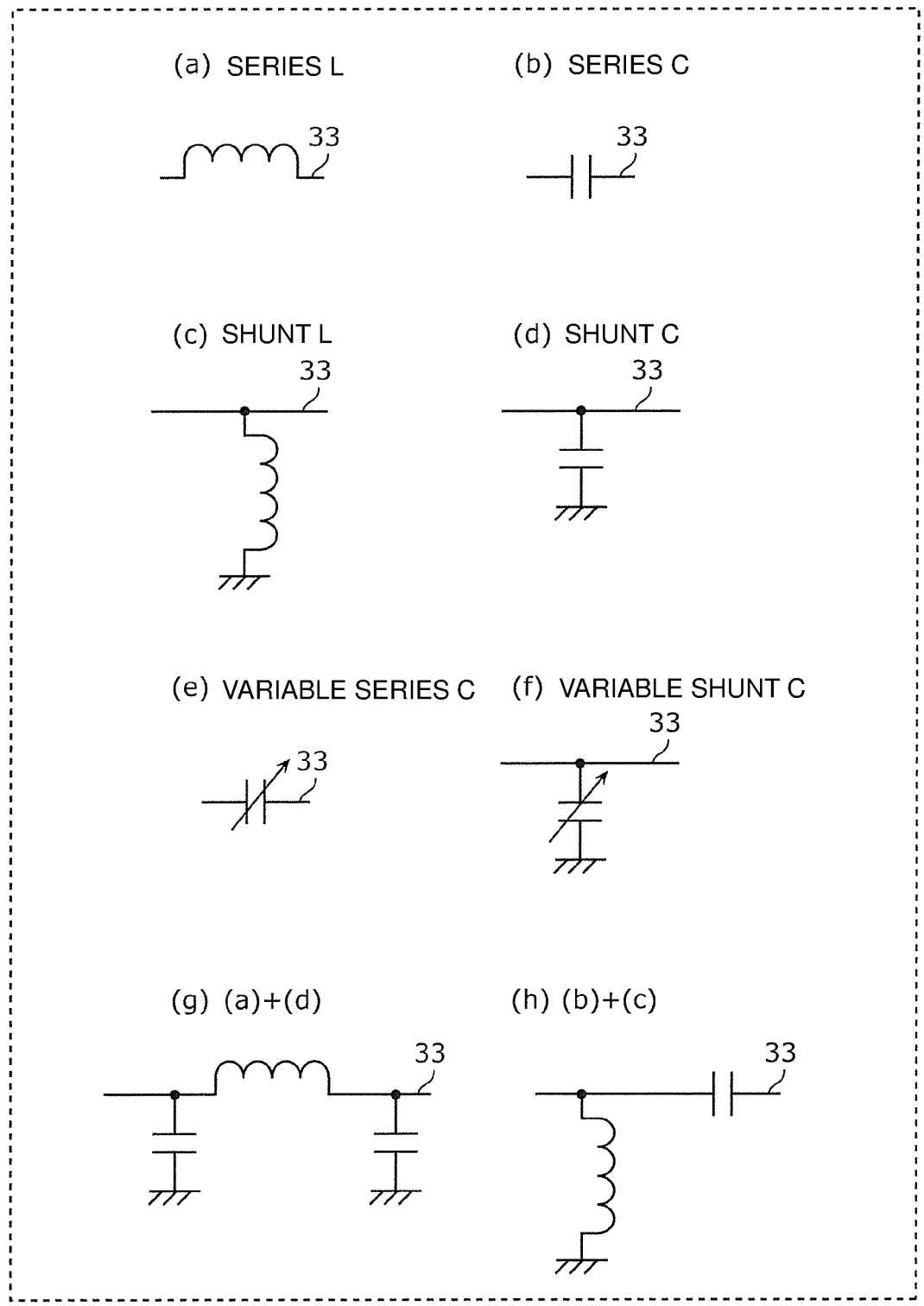
FIG. 10 is a circuit diagram of an example of the configuration of a matching circuit in the second preferred embodiment of the present invention.

FIG. 10 is a circuit diagram of an example of the configuration of the matching circuit 220.

As shown in FIG. 10, the matching circuit 220 may be defined by: (a) a series L, that is, an inductor provided in series with the bypass path 33; (b) a series C, that is, a capacitor provided in series with the bypass path 33; (c) a shunt L, that is, an inductor connected between the bypass path 33 and a ground; (d) a shunt C, that is, a capacitor connected between the bypass path 33 and a ground; (e) a variable series C, that is, a variable capacitor provided in series with the bypass path 33; (f) a variable shunt C, that is, a variable capacitor connected between the bypass path 33 and a ground; (g) a combination of (a) and (d); or (h) a combination of (b) and (c). The configuration of the matching circuit 220 is not limited to (a) through (h). A suitable combination of (a) through (h) may be used as the matching circuit 220.

The switch module 204 configured as described above operates in the following manner in accordance with a control signal.

As shown in FIG. 9A, in the switch circuit 210 in the non-CA mode, the common terminal 11 is connected to one of the selection terminals 12a, 12b, and 12c (selection terminal 12b in FIG. 9A) (first connection mode). With this configuration, a radio-frequency signal in the LB band (sending signal in Band 1 in this example) input from the terminal Port_b does not pass through the matching circuit 220 but is output from the common terminal 11 to the antenna ANT.

As shown in FIG. 9B, in the switch circuit 210 in the CA mode (using Band 1 and Band 3 in this example), the common terminal 11 is connected to the first bypass terminal 13, and also, the second bypass terminal 14 is connected to two of the selection terminals 12a, 12b, and 12c (selection terminals 12b and 12c in FIG. 9B) (second connection mode). With this configuration, a radio-frequency signal in the LB band (sending signal in Band 1 in this example) input from the terminal Port_b and a radio-frequency signal in the LB band (sending signal in Band 3 in this example) input from the terminal Port_c pass through the matching circuit 220 and are output from the common terminal 11 to the antenna ANT.

In the switch module 204 according to the second preferred embodiment, the switch circuit 210 is selectively switched between the first connection mode (see FIG. 9A) and the second connection mode (see FIG. 9B). Advantages similar to those of the first preferred embodiment are thus achieved.

This will be explained more specifically. In the first connection mode, a radio-frequency signal (in Band 1 in FIG. 9A) is transmitted without passing through the matching circuit 220, and the insertion loss is thus unlikely to increase. In the second connection mode, radio-frequency signals (in Band 1 and Band 3 in FIG. 9B) are transmitted via the matching circuit 220, thus making it possible to reduce impedance mismatching in the switch circuit 210. The switch circuit 210 is in the second connection mode when CA communication is being performed, while the switch circuit 210 is in the first connection mode when CA communication is not being performed. The insertion loss is thus less likely to increase in the non-CA mode while achieving desired characteristics in the CA mode by reducing impedance mismatching.

The matching circuit 220 is connected between the first and second bypass terminals 13 and 14. This reduces impedance mismatching regardless of with which selection terminals the second bypass terminal 14 is connected in the second connection mode. This eliminates the need to provide as many matching circuits as the selection terminals 12a, 12b, and 12c (that is, as many matching circuits as the bands), thus saving the space of the switch module 204.

By using the switch module 204 according to the second preferred embodiment, the switch circuit 210 is in the second connection mode when CA communication is being performed, while the switch circuit 210 is in the first connection mode when CA communication is not being performed. It is thus less likely to increase the insertion loss in the non-CA mode while achieving desired characteristics in the CA mode and also saving the space of the switch module 204, as in the first preferred embodiment.

Other Preferred Embodiments and Modifications

The present invention has been discussed through illustration of the preferred embodiments and the modified examples. However, the switch modules and the radio-frequency modules are not restricted to those in the above-described preferred embodiments and modified examples. Certain elements in the above-described preferred embodiments and modified examples may be combined to realize other preferred embodiments, and various modifications apparent to those skilled in the art may be made to the preferred embodiments or the modified examples without departing from the scope and spirit of the present invention. Such preferred embodiments and modified examples are also encompassed within the present invention. Additionally, various devices integrating the switch module and the radio-frequency module described above therein are also encompassed within the present invention.

In the above-described preferred embodiments and modified examples, one of a filter and the matching circuit 220 is preferably disposed on the bypass path 33. However, both of the filter and the matching circuit 220 may be disposed on the bypass path 33. In this case, the filter and the matching circuit 220 may be disposed in series with each other on the bypass path 33.

In the above-described preferred embodiments and modified examples, the filter and the matching circuit 220 preferably are provided outside the switch circuit. However, the filter and the matching circuit 220 may be integrated within the switch circuit.

In the above-described preferred embodiments and modified examples, as the two bands used in CA communication, preferably one of the bands is in the LB band, while the other band is in the MB band. However, two bands in the LB band or two bands in the MB band may be used in CA communication.

In the above-described preferred embodiments and modified examples, preferably the LB band is used as the low frequency band group, and the MB band is used as the high frequency band group. However, the low frequency band group and the high frequency band group are not limited to such frequency bands. A band group of about 400 MHz (that is, a very low band (VLB) band) may be used as the low frequency band group, and a band group of about 3000 MHz (that is, a high band (HB) band) may be used as the high frequency band group.

The radio-frequency module (front-end module in the above-described preferred embodiments and modified examples) may comply with a communication standard other than LTE.

In the switch module 204 of the second preferred embodiment, a transmitting radio-frequency signal is not restricted to a sending signal, but may be a received signal. Alternatively, both of a sending signal and a received signal may be transmitted.

Preferred embodiments of the present invention is applicable to a switch module, such as that included in a CA-support radio-frequency module, for example.

While preferred embodiments of the invention have been described above, it is to be understood that variations and modifications will be apparent to those skilled in the art without departing from the scope and spirit of the invention. The scope of the invention, therefore, is to be determined solely by the following claims.

What is claimed is:

1. A switch module comprising:
   a switch circuit including two or more selection terminals, a common terminal provided for the two or more selection terminals, and first and second bypass terminals; and
   a filter that is connected between the first and second bypass terminals and that reduces harmonics of a radio-frequency signal which passes through the filter; wherein
   the switch circuit is selectively switched between a first connection mode and a second connection mode, the first connection mode being a mode in which the common terminal is connected to any of the two or more selection terminals and is not connected to the filter, and the second connection mode being a mode in which the common terminal is connected to the first bypass terminal and the filter and the second bypass terminal is connected to any of the two or more selection terminals;
   the common terminal is connectable to more than one of the two or more selection terminals in the first connection mode;
   the second bypass terminal is connectable to more than one of the two or more selection terminals in the second connection mode; and
   the switch circuit includes a switching element between the second bypass terminal and the two or more selection terminals that selectively connects or disconnects a bypass path between the second bypass terminal and any of the two or more selection terminals in the second connection mode.

2. The switch module according to claim 1, wherein, in the first connection mode, at least one of the first and second bypass terminals is connected to a ground.

3. The switch module according to claim 2, wherein, in the first connection mode, both of the first and second bypass terminals are connected to the ground.

4. The switch module according to claim 1, wherein the filter includes a plurality of filters which are mutually exclusively selected and which reduce different orders of harmonics.

5. The switch module according to claim 4, wherein
the plurality of filters include a second harmonic filter and a third harmonic filter;
the first bypass terminal includes a plurality of first bypass terminals;
the second bypass terminal includes a plurality of second bypass terminals;
the second harmonic filter is connected between one of the plurality of first bypass terminals and one of the plurality of second bypass terminals; and
the third harmonic filter is connected between another one of the plurality of first bypass terminals and another one of the plurality of second bypass terminals.

6. The switch module according to claim 1, wherein the filter includes:
an LC parallel resonance filter that is disposed in series with a bypass path connecting the first and second bypass terminals and that includes an inductor and a capacitor connected in parallel with each other; and
a capacitor that is disposed in parallel with the LC parallel resonance filter and that is selectively connected in parallel with the LC parallel resonance filter in the second connection mode.

7. The switch module according to claim 6, wherein
the LC parallel resonance filter includes an inductor and a capacitor in parallel with each other and connected in series with the bypass path; and
capacitors are connected on both sides of the LC parallel resonance circuit in series with ground.

8. The switch module according to claim 1, wherein, in the second connection mode, the common terminal is electrically connected to one of the two or more selection terminals which is different from the selection terminal connected to the second bypass terminal.

9. A radio-frequency module which supports carrier aggregation in which radio-frequency signals in multiple frequency bands are simultaneously sent or received, the radio-frequency module comprising:
the switch module according claim 1; and
a control circuit that causes the switch circuit to be in the first connection mode when carrier aggregation is not being performed and causes the switch circuit to be in the second connection mode when carrier aggregation is being performed.

10. The radio-frequency module according to claim 9, wherein, in the first connection mode, at least one of the first and second bypass terminals is connected to a ground.

11. The radio-frequency module according to claim 10, wherein, in the first connection mode, both of the first and second bypass terminals are connected to the ground.

12. The radio-frequency module according to claim 9, wherein the filter includes a plurality of filters which are mutually exclusively selected and which reduce different orders of harmonics.

13. The radio-frequency module according to claim 12, wherein
the plurality of filters include a second harmonic filter and a third harmonic filter;
the first bypass terminal includes a plurality of first bypass terminals;
the second bypass terminal includes a plurality of second bypass terminals;
the second harmonic filter is connected between one of the plurality of first bypass terminals and one of the plurality of second bypass terminals; and
the third harmonic filter is connected between another one of the plurality of first bypass terminals and another one of the plurality of second bypass terminals.

14. The radio-frequency module according to claim 9, wherein the filter includes:
an LC parallel resonance filter that is disposed in series with a bypass path connecting the first and second bypass terminals and that includes an inductor and a capacitor connected in parallel with each other; and
a capacitor that is disposed in parallel with the LC parallel resonance filter and that is selectively connected in parallel with the LC parallel resonance filter in the second connection mode.

15. The radio-frequency module according to claim 14, wherein
the LC parallel resonance filter includes an inductor and a capacitor in parallel with each other and connected in series with the bypass path; and
capacitors are connected on both sides of the LC parallel resonance circuit in series with ground.

16. The radio-frequency module according to claim 9, wherein, in the second connection mode, the common terminal is electrically connected to one of the two or more selection terminals which is different from the selection terminal connected to the second bypass terminal.

17. A switch module comprising:
a switch circuit including two or more selection terminals, a common terminal provided for the two or more selection terminals, and first and second bypass terminals; and
a matching circuit connected between the first and second bypass terminals; wherein
the switch circuit is selectively switched between a first connection mode and a second connection mode, the first connection mode being a mode in which the common terminal is connected to any of the two or more selection terminals and is not connected to the matching circuit, and the second connection mode being a mode in which the common terminal is connected to the first bypass terminal and the matching circuit and the second bypass terminal is connected to any of the two or more selection terminals;
the common terminal is connectable to more than one of the two or more selection terminals in the first connection mode;
the second bypass terminal is connectable to more than one of the two or more selection terminals in the second connection mode; and
the switch circuit includes a switching element between the second bypass terminal and the two or more selection terminals that selectively connects or disconnects a bypass path between the second bypass terminal and any of the two or more selection terminals in the second connection mode.

18. The switch module according to claim 17, wherein the second bypass terminal is connected to two of the two or more selection terminals.

19. The switch module according to claim 17, wherein the matching circuit includes a connection to a ground.

20. The switch module according to claim 17, wherein the matching circuit includes at least one of:
an inductor provided in series with the bypass path;
a capacitor provided in series with the bypass path;

an inductor connected between the bypass path and a ground;
a capacitor connected between the bypass path and a ground;
a variable capacitor provided in series with the bypass path; and
a variable capacitor connected between the bypass path and a ground.

\* \* \* \* \*